United States Patent [19]
Yamazaki

[11] Patent Number: 4,659,507
[45] Date of Patent: Apr. 21, 1987

[54] SILICON FIBER AND METHOD OF MAKING THE SAME

[75] Inventor: Shunpei Yamazaki, Tokyo, Japan

[73] Assignee: Semiconductor Energy Laboratory Co., Ltd., Kanagawa, Japan

[21] Appl. No.: 726,407

[22] Filed: Apr. 23, 1985

Related U.S. Application Data

[62] Division of Ser. No. 647,544, Sep. 5, 1984, Pat. No. 4,604,231.

[30] Foreign Application Priority Data

Sep. 5, 1983 [JP] Japan .................................. 58-162795

[51] Int. Cl.⁴ .............................................. H01B 1/00
[52] U.S. Cl. ....................................... 252/500; 252/518; 252/512; 428/364; 428/401; 428/375; 423/341

[58] Field of Search ................ 252/518; 428/359, 364, 428/401, 379, 375; 423/341-343

[56] References Cited

U.S. PATENT DOCUMENTS

| | | | |
|---|---|---|---|
| 4,409,134 | 10/1983 | Yamazaki | 252/518 |
| 4,451,391 | 5/1984 | Marinace | 252/512 |
| 4,489,104 | 12/1984 | Lee | 252/518 |

Primary Examiner—Josephine L. Barr
Attorney, Agent, or Firm—Gerald J. Ferguson, Jr.; Michael P. Hoffman; Ronni S. Malamud

[57] ABSTRACT

A silicon fiber which has a structure expressed by $(SiF_2)_n$ where n is greater than 1 and where the fiber may be 1 mm or less in diameter.

4 Claims, 1 Drawing Figure

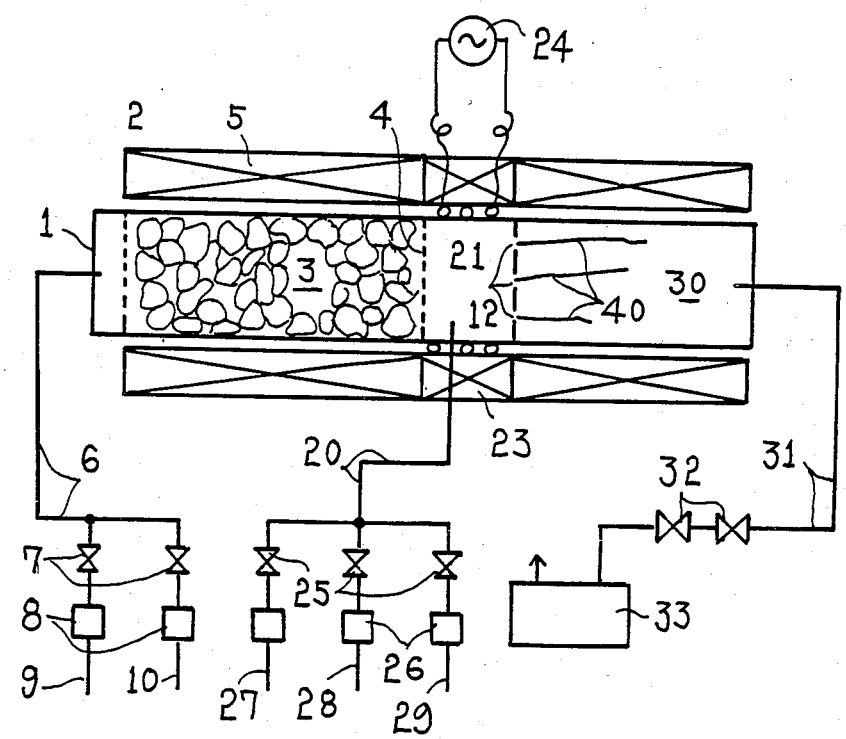

SILICON FIBER AND METHOD OF MAKING THE SAME

This is a Divisional application of Ser. No. 647,544, filed Sept. 5, 1984, now U.S. Pat. No. 4,604,231.

BACKGROUND OF THE INVENTION

1. Field of the Invention

The present invention relates to silicon fiber and its manufacturing method.

2. Description of the Prior Art

In recent years carbon fiber having a $(CH_2)_m$ (where $m > 1$) has been employed for various purposes.

However, the carbon fiber is electrically insulating, and hence is not used for utilization of electrical conductive, rectifying and amplifying properties.

Further, the carbon fiber is relatively poor in heat resistance, and hence is not used in atmospheres above 500° C.

For the reasons given above, there are severe limitations on the broadening of its application to the field of electronics engineering.

SUMMARY OF THE INVENTION

It is therefore an object of the present invention to provide a novel silicon fiber the application of which can be broadened to the field of electronics.

The silicon fiber of the present invention has a structure expressed by $(SiF_2)_n$ (where $n > 1$). Such a silicon fiber has higher heat resistance than does the above said carbon fiber.

The silicon fiber of the present invention permits the doping, to a high concentration, of a P-type impurity and/or N-type impurity which is widely used in the manufacture of a semiconductor device utilizing silicon. Therefore, the entire or a selected region of the fiber can be made electrically conductive or P- or N-type in the direction of its diameter along the entire or a selected length of the fiber.

BRIEF DESCRIPTION OF THE DRAWING

The accompanying sheet of a drawing is a schematic diagram illustrating an apparatus for the fabrication of the $(SiF_2)_n$ fiber of the present invention, explanatory of the fiber and its manufacturing method according to present invention.

DESCRIPTION OF THE PREFERRED EMBODIMENTS

Referring to the drawing, the $(SiF_2)_n$ fiber of the present invention will hereinafter be described in connection with its manufacturing method.

A number of silicon ingots 2 of high purity and each having a size of about 0.1 to 1.1 cm³ are placed in a chamber 1 of a transparent ceramic material at one half portion lengthwise thereof. The region 3 in which the silicon ingots 2 are housed is defined by ceramic meshs 4 and 4'. The silicon ingot housing region 3 is heated up to a high temperature above 1000 C., for example, 1150 C., by a heater 5 disposed on the outside of the chamber 1.

The silicon ingot housing region 3 is connected through an external pipe 6, valve means 7 and a flowmeter 8 from the end of the chamber 1 on the side of the region 3 to a fluorine material gas source 9 and another hydrogen, $SiCl_4$ gas or like material or carrier gas source 10.

In the chamber 1 there is disposed a ceramic plate 12 having many 1 mm or less diameter pores 11 in a manner to define between it and the mesh 4 a central space region 21 for creating an $(SiF_2)_n$.

The central space region 21 is held at a temperature in the range of 300 to −182 C., in particular, between room temperature and −77 C., by thermo control means 22, such as heating means, cooling means and temperature maintaining means, disposed around the chamber 1.

The central space region 21 is connected via an external pipe 24, a valve 25 and a flowmeter 26 to a P-type impurity material gas source 27, an N-type impurity material gas source 28 and a hydrogen or like carrier gas source 29.

The central space region 21 is supplied, as required, with high-frequency power from a high-frequency coil 23 disposed around the chamber 1 and connected to a high-frequency source 24.

A fiber forming space region 30 is defined in the chamber 1 adjacent to the space region 11 on the opposite side from the silicon ingot housing region 3. The fiber forming space region 30 is connected to exhaust means (a pump) 33 through extension pipe means 31 and valve means 32 extending from the space region 30 on the opposite side from the space region 21.

At first, hydrogen gas from the gas source 10 is introduced into the chamber 1 fron the side of the silicon ingot housing region 3 while evacuating the chamber 1 by means of the pump 33. By this, oxides on the surfaces of the silicon ingots 2 are removed by deoxidization, and at the same time, the interior of the chamber 1 is cleaned.

Next, $SiF_4$ gas from the fluorine gas source 9 is introduced into the chamber 1 from the side of the region 3 at a flow rate of 100 to 1000 cc/min. In this case, fluorine gas in the $SiF_4$ gas is decomposed and reacts with silicon of the silicon ingots 2, forming $SiF_2$ gas in the region 3. The $SiF_2$ gas is introduced into the central region 21, wherein $(SiF_2)$ (where $n > 1$) having a high molecular structure is created. The creation of the $(SiF_2)$ is promoted by a high frequency having a 13.56 MHz frequency and a 0.001 to 20 W power, supplied from the high-frequency coil 23.

The $(SiF_2)$ created in the central region 21 flows through the pores 11 into the fiber forming region 30. In this process, a long and 1 mm or less diameter $(SiF_2)_n$ fiber 40 is formed.

By introducing into the central region 21 the P-type impurity from the P-type impurity gas source 27, for example, diborane $(B_2H_6)$ gas, and/or the N-type impurity from the N-type impurity gas source 28, for example, phosphine $(PH_3)$ gas, while controlling their quantities and the time for their introduction, it is possible to introduce the P-type and/or the N-type impurity into the $(SiF_2)_n$ fiber 40 throughout it or locally. Accordingly, the $(SiF_2)$ fiber 40 can be made to be conductive or have a PN junction or PIN junction as in the case of a semiconductor device.

What is claimed is:

1. A silicon fiber manufacturing method comprising the steps of:
   causing silicon and silicon tetrafluoride ($SiF_4$) to react with each other at a temperature above 1000 C. to form $SiF_2$ gas;
   forming $(SiF_2)_n$ (where $n > 1$) from the $SiF_2$ gas; and passing the (SiF$_2$) through pores, thereby manufacturing a silicon fiber having a structure expressed by (SiF$_2$)$_n$.

2. The manufacturing method according to claim 1, wherein in the process of creating the SiF$_2$ gas or (SiF$_2$)$_n$, a P- or N-type impurity is mixed into the SiF$_2$ gas or (SiF$_2$)$_n$, providing the silicon fiber with at least one of a P- or N-type impurity doped region.

3. The manufacturing method according to claim 1 or 2, wherein in the process of creating the SiF$_2$ gas or (SiF$_2$)$_n$, hydrogen is mixed into the SiF$_2$ gas or (SiF$_2$)$_n$, obtaining the silicon fiber having introduced thereinto the hydrogen as a dangling bond neutralizer.

4. The manufacturing method according to claim 1, wherein the pores are 1 mm or less in diameter, and the silicon fiber has a diameter of 1 mm or less.

* * * * *